(12) United States Patent
Chee et al.

(10) Patent No.: US 8,324,956 B2
(45) Date of Patent: Dec. 4, 2012

(54) FLEXIBLE LOW NOISE, HIGH LINEARITY, HIGH FREQUENCY, LOW POWER, FULLY DIFFERENTIAL MIXER AND CLASS AB POST-MIXER AMPLIFIER SYSTEM FOR SDR APPLICATIONS

(75) Inventors: Chong Hin Chee, Gelugor (MY); Paul H. Gailus, Prospect Heights, IL (US); Shafiullah Syed, Parkland, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 91 days.

(21) Appl. No.: 12/980,147

(22) Filed: Dec. 28, 2010

(65) Prior Publication Data

US 2012/0161844 A1   Jun. 28, 2012

(51) Int. Cl.
*H03F 3/45* (2006.01)
*G06G 7/12* (2006.01)
(52) U.S. Cl. ....................... 327/355; 455/323
(58) Field of Classification Search .......... 327/355–361; 455/323, 326
See application file for complete search history.

(56) References Cited

U.S. PATENT DOCUMENTS 5,327,098 A * 7/1994 Molina et al. ................. 330/254
6,388,502 B2 * 5/2002 Kaneki et al. ................. 327/359

OTHER PUBLICATIONS

Frederico Agnelli, et al. "Wireless Multi-Standard Terminals: System Analysis and Design of a Reconfigurable RF Front-End", IEEE Circuits and Systems Magazine, First Quarter 2006; 22 Pages.
Laurent Perraud, et al. "A Direct-Conversion CMOS Transceiver for the 802.11a/b/g WLAN Standard Utilizing a Cartesian Feedback Transmitter", New Logic Technologies, Sophia Antipolis, France; Jul. 12, 2004; 13 Pages.
Ivan Padilla-Cantoya, et al. "Class AB Low-Voltage CMOS Voltage Follower", IEEE Explore, 2007; 4 Pages.
Patt Boonyaporn, et al. "A High Performance Class AB CMOS Rail to Rail Voltage Follower", IEEE Explore; 2002; 4 Pages.

* cited by examiner

*Primary Examiner* — Dinh T. Le
(74) *Attorney, Agent, or Firm* — Anthony P. Curtis; Daniel R. Bestor

(57) ABSTRACT

A post-mixer amplifier device which receives and processes signals for use in a software-defined radio integrated circuit is provided. The post-mixer amplifier device includes but is not limited to a voltage amplifier having first and second inputs and a first output, a positive signal output connected with the first output of the voltage amplifier, and a positive signal input connected with a first bipolar junction transistor along a first pathway. The first bipolar junction transistor includes but is not limited to a first collector connected with a the first input of the voltage amplifier and a first emitter connected with an second output of the push-pull unity gain follower and forming a first current feedback pathway. The first bipolar junction transistor is driven with a passive resistive load.

16 Claims, 11 Drawing Sheets

FLEXIBLE LOW NOISE, HIGH LINEARITY, HIGH FREQUENCY, LOW POWER, FULLY DIFFERENTIAL MIXER AND CLASS AB POST-MIXER AMPLIFIER SYSTEM FOR SDR APPLICATIONS

FIELD OF THE INVENTION

The present invention relates generally to an amplifier system for software-defined radio (SDR) applications. In particular, the invention relates to a flexible low noise, high linearity, high frequency, low power, fully differential mixer and class AB post-mixer amplifier system for SDR applications.

BACKGROUND

In a receiver (RX) lineup having differential circuitry, such as an RFIC for governmental and public safety use, there is often a need for a low power, low noise, local oscillator (LO) feed-through and a high linearity and passive doubly-balanced type mixer. It had been thought that a low noise, high linearity receiver is better designed by using a current-mode topology. In using a current-mode topology, a low-noise amplifier (LNA) has a transconductance amplifier pushing and pulling current through mixer switches into a low input impedance ($Z_{in}$) of a post-mixer amplifier (PMA). However, since the LNA of the current-mode topology typically has a high output impedance ($Z_{out}$), such a combination may lead to linearity degradation at high frequencies due to the fact that conductance for the mixer gets smaller (larger resistance) at higher LO frequencies causing the high impedance output stage of the LNA to compress.

One alternative to using the current-mode topology is to use a Voltage-Mode LNA with a low $Z_{out}$ and using a resistance of the mixer as part of a gain-setting resistor pair of the PMA. However, the value of the effective resistance of the mixer is dependent upon the switching frequency, and the higher the value of the effective resistance is, the lower the overall gain of the PMA. In order to overcome this problem, any switching resistance of the mixer could be made insignificant by inserting a large-enough series resistor in between the mixer and the input of the PMA, such that the gain of the PMA no longer is dependent upon the mixer. As a result, if the LO of the mixer needs to vary over a very wide band, it is better to use a 'voltage-mode' design with low $Z_{out}$ LNAs driving passive mixers which have near zero current through them into a high $Z_{in}$ PMA.

It is also desirable for the RX lineup to have very low noise. This leads to avoiding the use of an inverting op-amp configuration in the PMA as a very large resistor would be used to realize a large $Z_{in}$, thereby causing a significant amount of thermal noise. Furthermore, if bipolar transistors are utilized at the PMA inputs to ensure low close-in noise, the transistor base current results in DC current through the resistors connected to the PMA inputs, which results in an additional source of noise (flicker noise). A large resistor also uses an extensive amount of surface area on the semiconductor wafer on which the PMA is fabricated.

One alternative way to implement a fully-differential non-inverting PMA configuration uses an op-amp topology having dual-input differential pairs. However, this op-amp topology has several weaknesses. First, the extra active input devices add uncorrelated noise in the signal path. Second, a Common-Mode Feedback (CMFB) structure is present in the op-amp topology. The CMFB structure adds noise and complicates, if not limits, a large gain-bandwidth design. Third, increasing the number of devices used in a given topology also increases the parasitic capacitances in that topology. These parasitic capacitances need to be driven, thereby increasing the power used. Fourth, using CMFB structures also burns additional power.

As a result, it would be desirable to provide a fully differential mixer and class AB post-mixer amplifier system for SDR applications that is flexible, low noise, high linearity, high frequency, and low power. Furthermore, it would also be desirable to provide a radio frequency integrated circuit (RFIC) architecture that includes a post-mixer amplifier with improved characteristics.

SUMMARY

In one aspect, a post-mixer amplifier device which receives and processes signals for use in a software-defined radio integrated circuit is provided. The post-mixer amplifier device includes but is not limited to a voltage amplifier having first and second inputs and a first output, a push-pull unity gain follower having a third input and a second output, a positive signal output connected with the second output of the push-pull unity gain follower, and a positive signal input connected with a first switch. The third input is connected with the first output of the voltage amplifier. The first switch is selectable between a first pathway and a second pathway.

The post-mixer amplifier device also includes but is not limited to a first bipolar junction transistor connected with the positive signal input along the first pathway. The first bipolar junction transistor includes but is not limited to a first collector connected with a the first input of the voltage amplifier and a first emitter connected with an second output of the push-pull unity gain follower and forming a first current feedback pathway. The post-mixer amplifier device also includes but is not limited to a second bipolar junction transistor connected with the positive signal input along the second pathway. The second bipolar junction transistor includes but is not limited to a second collector connected with a the first input of the voltage amplifier and a second emitter connected with an second output of the push-pull unity gain follower and forming a second current feedback pathway. The first and second bipolar junction transistors drive a passive resistive load.

In another aspect, a post-mixer amplifier device which receives and processes signals for use in a software-defined radio integrated circuit is provided. The post-mixer amplifier device includes but is not limited to a voltage amplifier having first and second inputs and a first output, a positive signal output connected with the first output of the voltage amplifier, and a positive signal input connected with a first bipolar junction transistor along a first pathway. The first bipolar junction transistor includes but is not limited to a first collector connected with a the first input of the voltage amplifier and a first emitter connected with an second output of the push-pull unity gain follower and forming a first current feedback pathway. The first bipolar junction transistor drives a passive resistive load.

In another aspect, an integrated circuit is provided. The integrated circuit includes but is not limited to a passive mixer outputting positive and negative signals and a post-mixer amplifier which receives and processes the positive and negative signals. The post-mixer amplifier device includes but is not limited to a voltage amplifier having first and second inputs and a first output, a positive signal output connected with the first output of the voltage amplifier, and a positive signal input connected with a first bipolar junction transistor along a first pathway. The first bipolar junction transistor includes but is not limited to a first collector connected with a the first input of the voltage amplifier and a first emitter connected with an second output of the push-pull unity gain follower and forming a first current feedback pathway. The first bipolar junction transistor drives a passive resistive load.

The scope of the present invention is defined solely by the appended claims and is not affected by the statements within this summary.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION

In the description that follows, the subject matter of the application will be described with reference to acts and symbolic representations of operations that are performed by one or more electronic devices, unless indicated otherwise. However, although the subject matter of the application is being described in the foregoing context, it is not meant to be limiting as those skilled in the art will appreciate that some of the acts and operations described hereinafter can also be implemented in hardware, software, and/or firmware and/or some combination thereof.

The present invention makes use of a unique current-feedback topology for a radio frequency integrated circuit (RFIC) architecture. The RFIC architecture includes a post-mixer amplifier with a third order input intercept point (IIP3) greater than 20 dBV, less than 3.5 nV/rtHz input-referred noise up to 1 MHz operation, high $Z_{in}$ of greater than 1 MOhm at very low power with the ability to improve linearity further by switching to a lower gain where an external LNA may be used.

Figure 1:
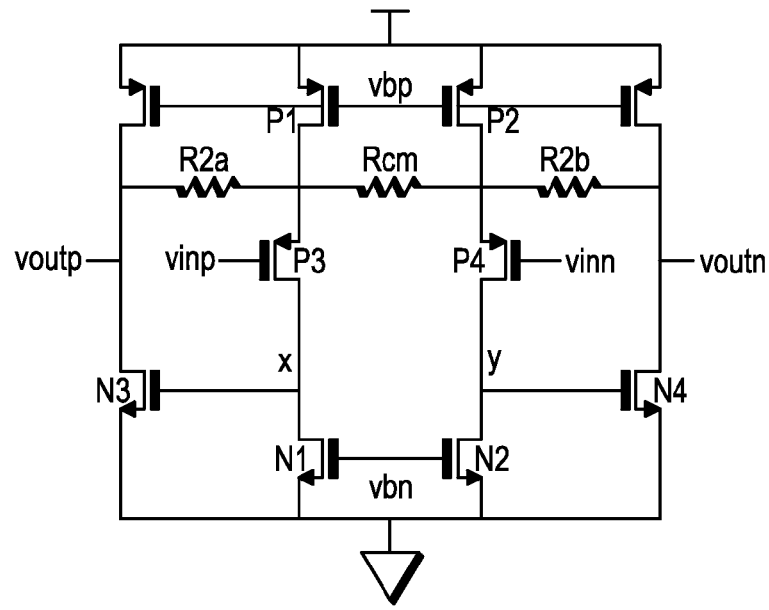
FIG. 1 depicts a schematic representation of a prior art current-feedback amplifier topology.
Figure 2:
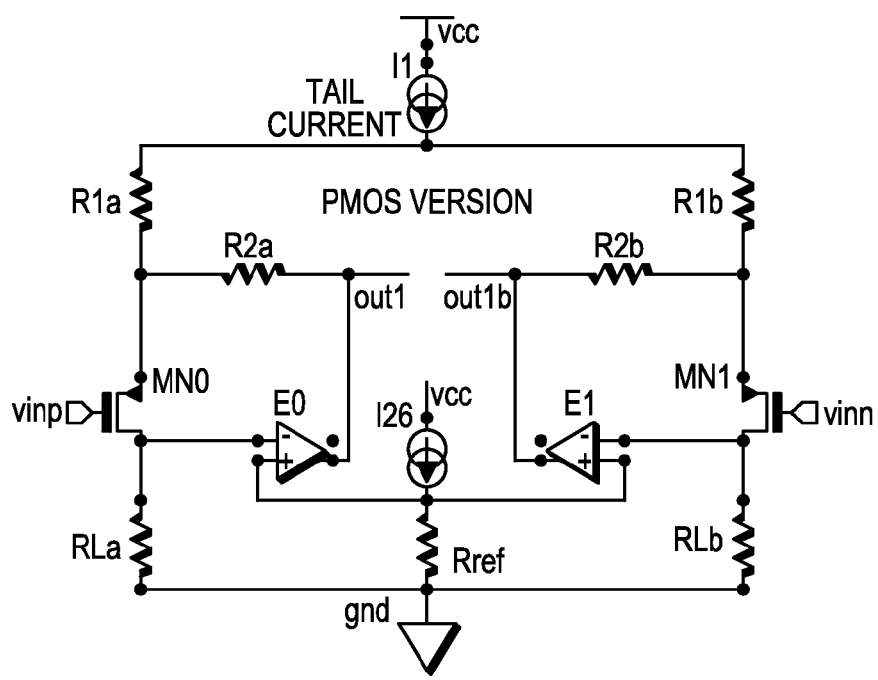
FIG. 2 depicts a schematic representation of a prior art current-feedback amplifier topology with pFET transistors.
Figure 13:
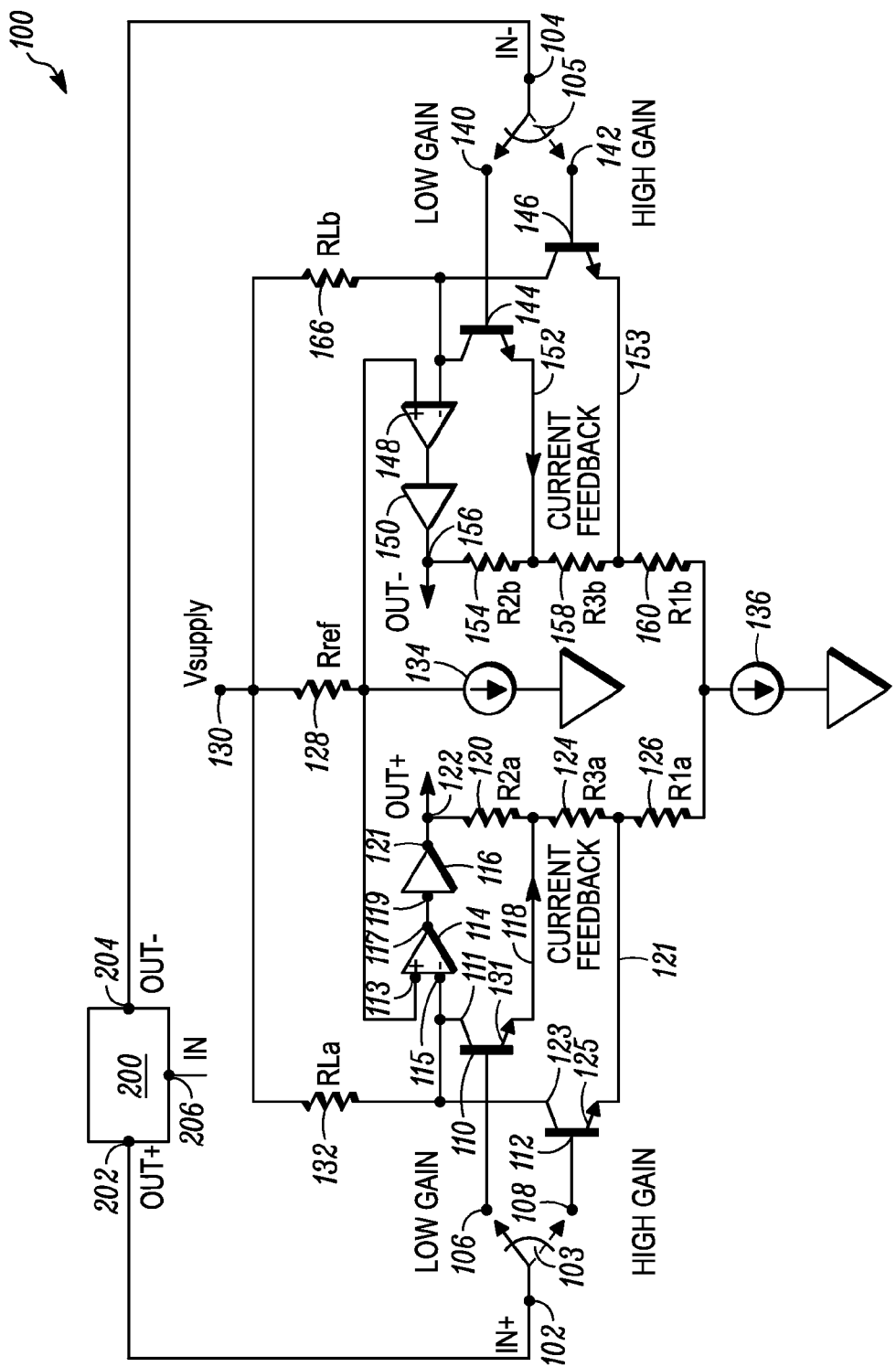
FIG. 13 depicts a schematic representation of a post-mixer amplifier, in accordance with one embodiment of the present invention.

With reference to FIG. 13, an RCX lineup is shown. The RCX lineup has an LNA and mixer 100 feeding into a current-conveyor that amplifies a signal and then passes the signal into active filters stages (not shown). The current-mode feedback amplifier topology shown in FIG. 1 is modified to provide a class AB post-mixer amplifier 100 having a high input impedance $(Z_{in})$ in order to decrease noise and thereby increase signal-to-noise ratio. Post-mixer amplifier 100 uses bipolar transistors 110, 112, 144, and 146 to replace PMOS input transistors. This replacement reduces close-in noise as bipolar transistors 110, 112, 144, and 146 have much lower 1/f 'flicker' noise than field-effect transistors (FETs).

Post-mixer amplifier 100 also differs from the topology shown in FIG. 1 in that PMOS current-sources (P1 and P2) are converted into a single tail but with $R_{cm}$ split into two. By doing so, the noise of a tail current source is common to both positive signal output (Out+) 122 and negative signal output (Out−) 156 and therefore can be differentially cancelled out. Post-mixer amplifier 100 uses resistors, preferably non-poly resistors, rather than FETs $N_1$ and $N_2$. As FETs form active loads, which contribute significant flicker noise, the use of resistors further reduces flicker noise. By doing so, any voltage gain at nodes x and y of the topology shown in FIG. 1 is drastically reduced in the amplifier 100 of FIG. 16. Furthermore, post-mixer amplifier 100 uses an operational transconductance amplifier (OTA) or voltage-mode amplifier (VMA) 114 in place of FETs $N_3$ and $N_4$ of FIG. 1, which provide the current feedback through R2a and R2b into source terminals of $P_3$ and $P_4$ respectively.

Figure 3:
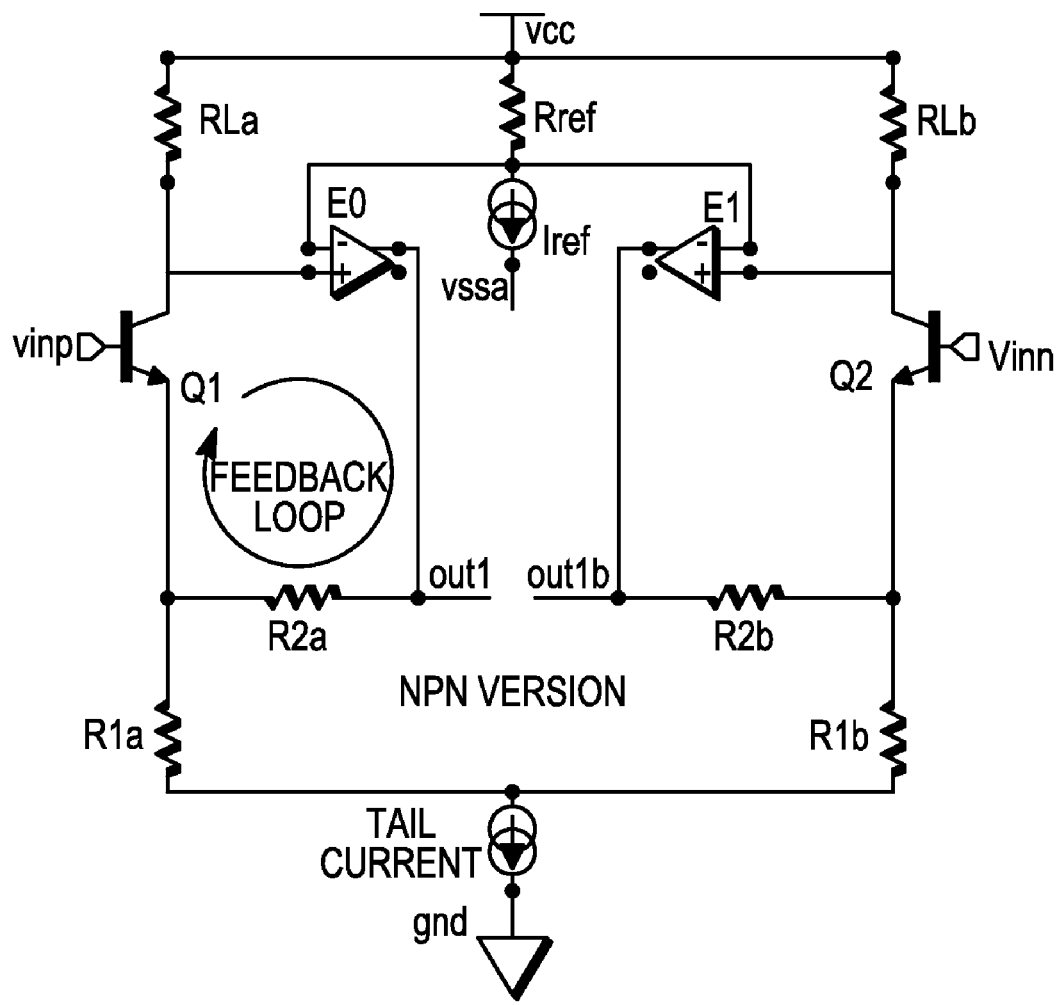
FIG. 3 depicts a schematic representation of a reconfigured current-feedback amplifier topology with NPN transistors, in accordance with one embodiment of the present invention.

The resultant structure for post-mixer amplifier 100 is illustrated in FIG. 3, where $R_{cm}$ becomes $R_{1a}+R_{1b}$. The gain of the post-mixer amplifier 100 becomes: $V_a=1+R_2/R_1$ and the post-mixer amplifier 100 can include either PNP or NPN transistors as the input differential pair.

In accordance with one embodiment, operation of post-mixer amplifier 100 is briefly described as follows. With reference to FIG. 3, assuming the input voltage $(V_{inp})$ goes high, $Q_1$ emitter will rise, causing a larger voltage drop across $R_{1a}$. The extra demand in current causes $Q_1$ collector to drop, which is then inversely amplified by $E_0$ causing first output $(out_1)$ to rise and force current through resistor $R_{2a}$ and into $Q_1$ emitter, thus fulfilling any demand in current and closing the feedback loop shown in FIG. 3. The current through $R_{2a}$ creates a voltage across $R_{2a}$ and thus if $R_{1a}$ is larger than $R_{1a'}$, a delta increase in current will cause a larger voltage drop in proportion to the ratio of $R_{2a}$ to $R_{1a}$. Thus the voltage gain is $1+R_{2a}/R_{1a}$. In the topology for post-mixer amplifier 100 shown in FIG. 3, the main noise contributors are the input transistors, $Q_1$ and $Q_2$, together with $R_{1a}$ and $R_{1b}$.

As mentioned above, the values for $R_{1a}$ and $R_{1b}$ are small to achieve very low noise performance. Preferably, values for $R_{1a}$ and $R_{1b}$ are less than a few hundred ohms. If the values for $R_{1a}$ and $R_{1b}$ are small, then voltage mode amplifiers $E_0$ and $E_1$ of the post-mixer amplifier 100 shown in FIG. 3, should supply a large amount of AC current to be able to provide a feedback current and also drive an external load. Additionally, in certain circumstances, it may be desirable for an RFIC to maintain an IIP3 of >20 dBV up to 1 MHz.

In order to enable a high-speed, high-linearity and low standby power architecture, voltage mode amplifiers $E_0$ and $E_1$, shown in FIG. 3, have large open loop gain and large gain-bandwidth product with a Class AB stage. This permits the architecture to maintain low DC power consumption while being able to drive +/−1.2 mA over a voltage swing of 1.4 mVpp.

Figure 4:
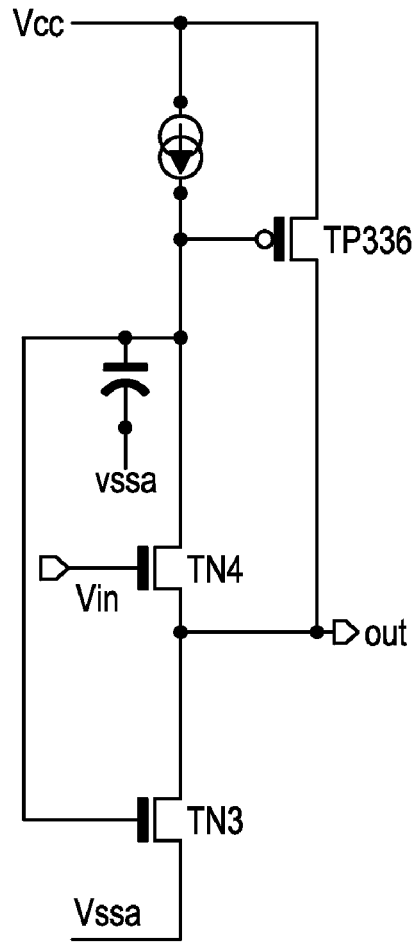
FIGS. 4 and 5 depicts a schematic representation of a first transistor (TN3) that provides Class AB sinking ability and a second transistor (TP336) that provides Class AB sourcing ability, in accordance with one embodiment of the present invention.
Figure 5:
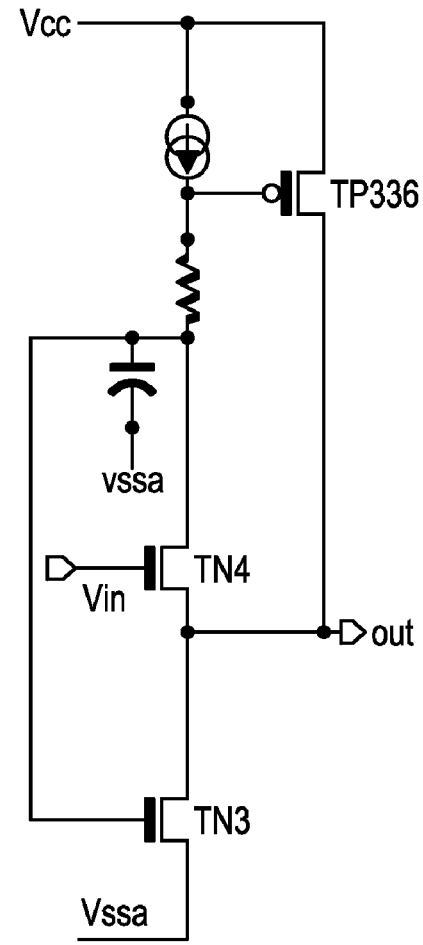

In another embodiment, the post-mixer amplifier 100 shown in FIG. 3 is modified to employ a high linearity, high frequency, low power, unity gain, voltage shift buffer known as a push-pull unity gain follower 116 (also called a push-pull unity gain buffer), as shown in FIG. 13. In the embodiments of a push-pull unity gain follower illustrated in FIGS. 4 and 5, post-mixer amplifier 100 employs an n-channel MOSFET transistor TN3 and a p-channel MOSFET transistor TP336 to provide Class AB sinking and sourcing capabilities respectively. As illustrated in FIGS. 4 and 5, transistor TN3 provides Class AB sinking ability and transistor TP336 provides Class AB sourcing ability. While prior unity gain buffers have a limited current sourcing or sinking capability, transistor TP336 provides nearly unlimited sourcing ability and transistor TN3 provides nearly unlimited sinking ability. However, the quiescent current of transistor TP336 is supply dependent because the gate voltage ($V_{gs}$) of transistor TN3 (also the gate voltage of transistor TP336) is partially fixed to ground return Vssa whereas the source voltage of transistor TP336 is tied to a supply voltage Vcc. However, the $g_m$ of transistor TP336 may not be able to be tuned to provide more sourcing ability without sacrificing additional quiescent current.

With reference to FIG. 5, the $g_m$ of transistor TP336 can be decoupled somewhat from the Vgs of transistor TN3. Now, the $g_m$ of transistor TP336 can be made large and resistor $R_{shift}$ can be sized independently to tune a preferred quiescent operating point. However, transistor TP336 is still voltage supply dependent and transistor TN4 can potentially be compressed into a triode region because of an additional voltage drop across resistor $R_{shift}$.

Figure 6:
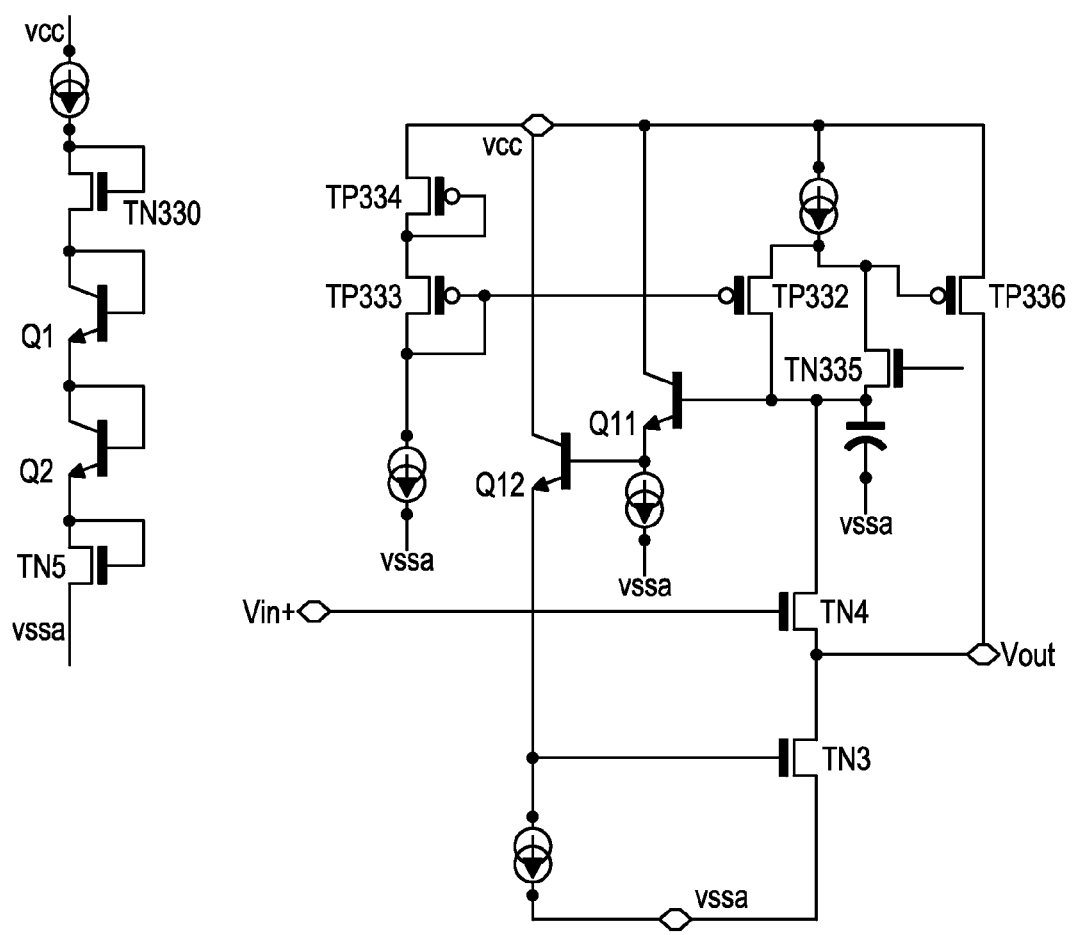
FIG. 6 depicts a schematic representation of a circuit having a 'magic resistor,' in accordance with one embodiment of the present invention.

To combat this problem, as shown in the embodiment of FIG. 6, a 'Magic Resistor' is used. As shown in FIG. 6, transistors Q12 and Q11 are introduced to provide an additional voltage shift to allow the drain voltage of transistor TN4 to be shifted up so that a wider voltage swing can be achieved whilst the output voltage ($V_{O1}$) is biased at 1.0V. Transistors TP332 and TN335 make up the magic resistor whereby at quiescent operating conditions, the magic resistor presents a resistance that is large enough to keep transistor TP336 biased at a fixed quiescent current and independent of the drain voltage of transistor TN4. However, when it is desirable to maximize the gate-to-source voltage $V_{gs}$ of transistor TP336, the drain voltage of transistor TN4 ($V_{d4}$) drops.

This expands the $V_{gs}$ of transistor TN335, causing its ON resistance to drop and thereby effectively dropping the effective resistance of the magic resistor. Transistors TP332 and TN335 are biased via a replica biasing technique in which the $V_{gs}$ of transistors TP332 and TP336 matches that of transistors TP333 and TP334 referenced to supply voltage $V_{cc}$ if the bias currents and sizes are equal. Therefore, the biasing conditions tracks shifts in V. Similarly, the biasing of transistor TN335 gate is replicated by the stack of transistors, TN330 (~TN335), Q1(~Q11), Q2(~Q12) and TN5(~TN3).

Figure 7:
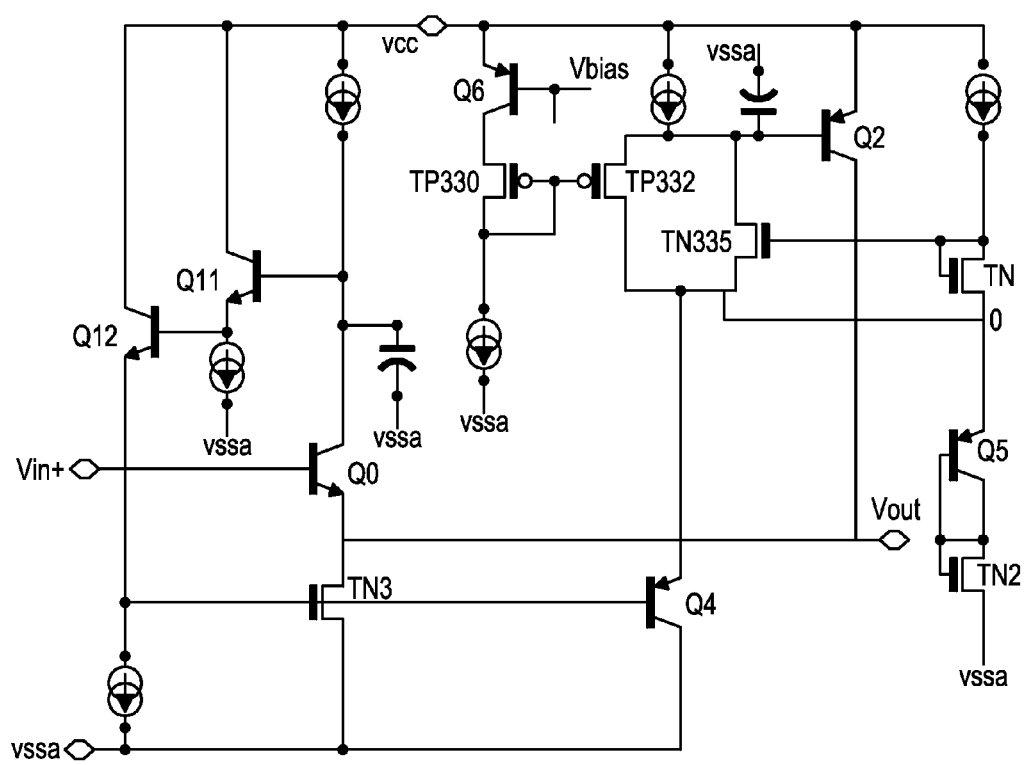
FIG. 7 depicts a schematic representation of a circuit having a folded 'magic resistor,' in accordance with one embodiment of the present invention.

However, at 2.775V, with a potential drop of the supply down to 2.65V and at cold temperatures (−40° C.), the large voltage stack-up will expand beyond which the supply rail can support. The embodiment illustrated in FIG. 7 is provided to combat this problem. In FIG. 7, the VPNP bias is folded over to a parallel branch, and this therefore is called the 'Folded Magic Resistor' solution. As shown in FIG. 7, transistor TN4 is replaced by an NPN bipolar transistor Q0 and transistor TP336 is replaced by a PNP bipolar transistor Q2, which illustrates that the architecture herein is technology independent. PNP bipolar transistor Q4 replicates the voltage at the collector of Q0 which in FIG. 4 is really the same AC voltage as transistor TN3's gate. By doing so, $V_g$ and $V_{be}$ stackup requirements are reduced by 1 (~0.7V), allowing the post-mixer amplifier 100 to work at lower $V_{cc}$ supplies.

Figure 8:
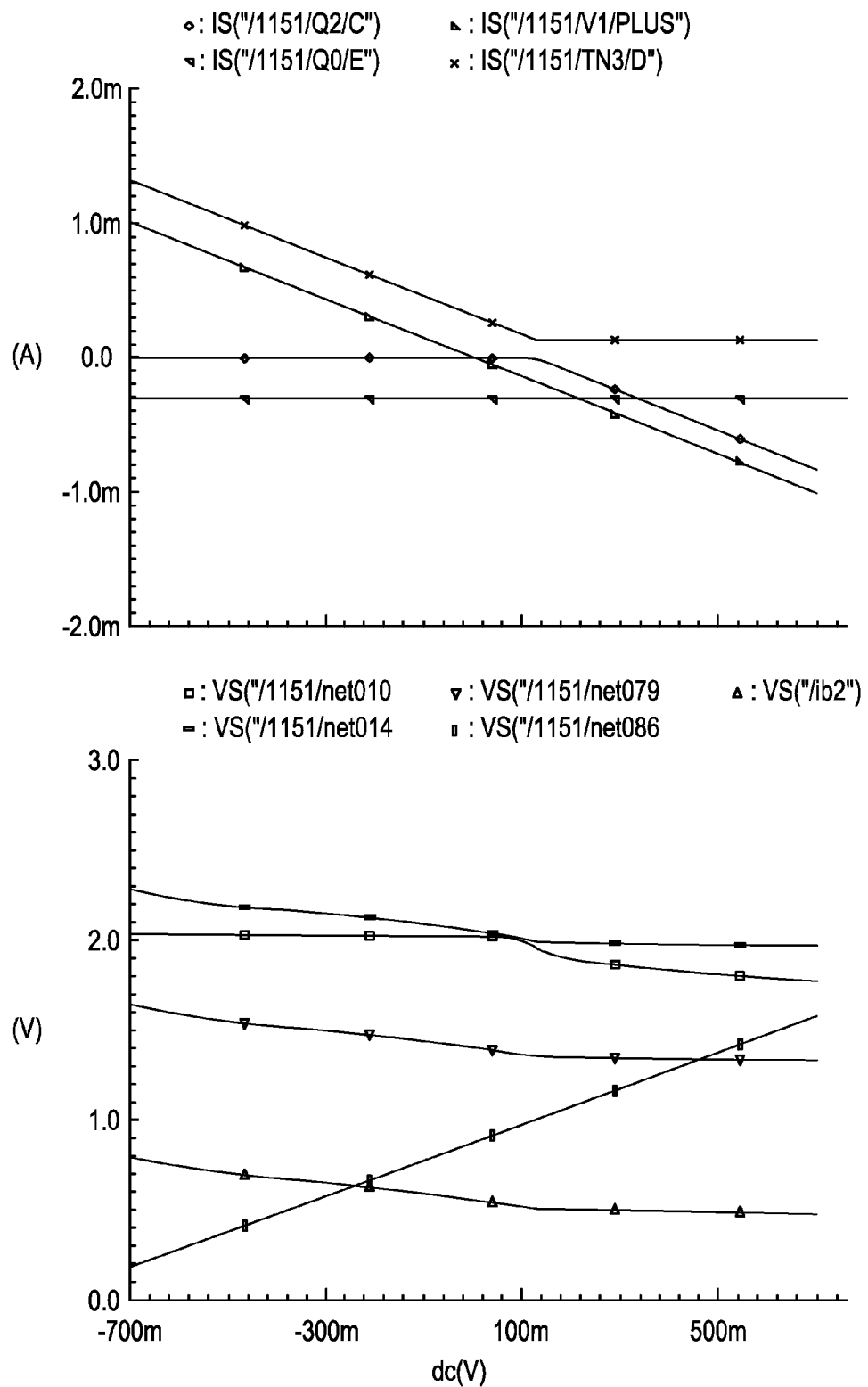
FIG. 8 depicts a graph of a DC sweep and color coding showing Class AB operation of the present invention and linearity performance versus a standard Class A voltage follower, in accordance with one embodiment of the present invention. An upper graph shows currents through various devices highlighted at terminals of respective devices and a lower graph which shows node voltages, in accordance with one embodiment of the present invention. In the range of $V_{in}$ (X-axis) going from 0 to approx. 100 mV, a collector voltage of $Q_0$ (red voltage curve in lower graph) will gradually drop compressing the BJT until a $Q_2$ collector current (purple in the upper graph) takes over the pull-up action.

With reference to FIG. 8, a DC sweep of the various node voltages demonstrates the Class AB characteristics of the post-mixer amplifier 100 illustrated in FIG. 7. Q0 is biased at a quiescent current of 300 uA but is capable of sinking and sourcing >1 mA.

Figure 9:
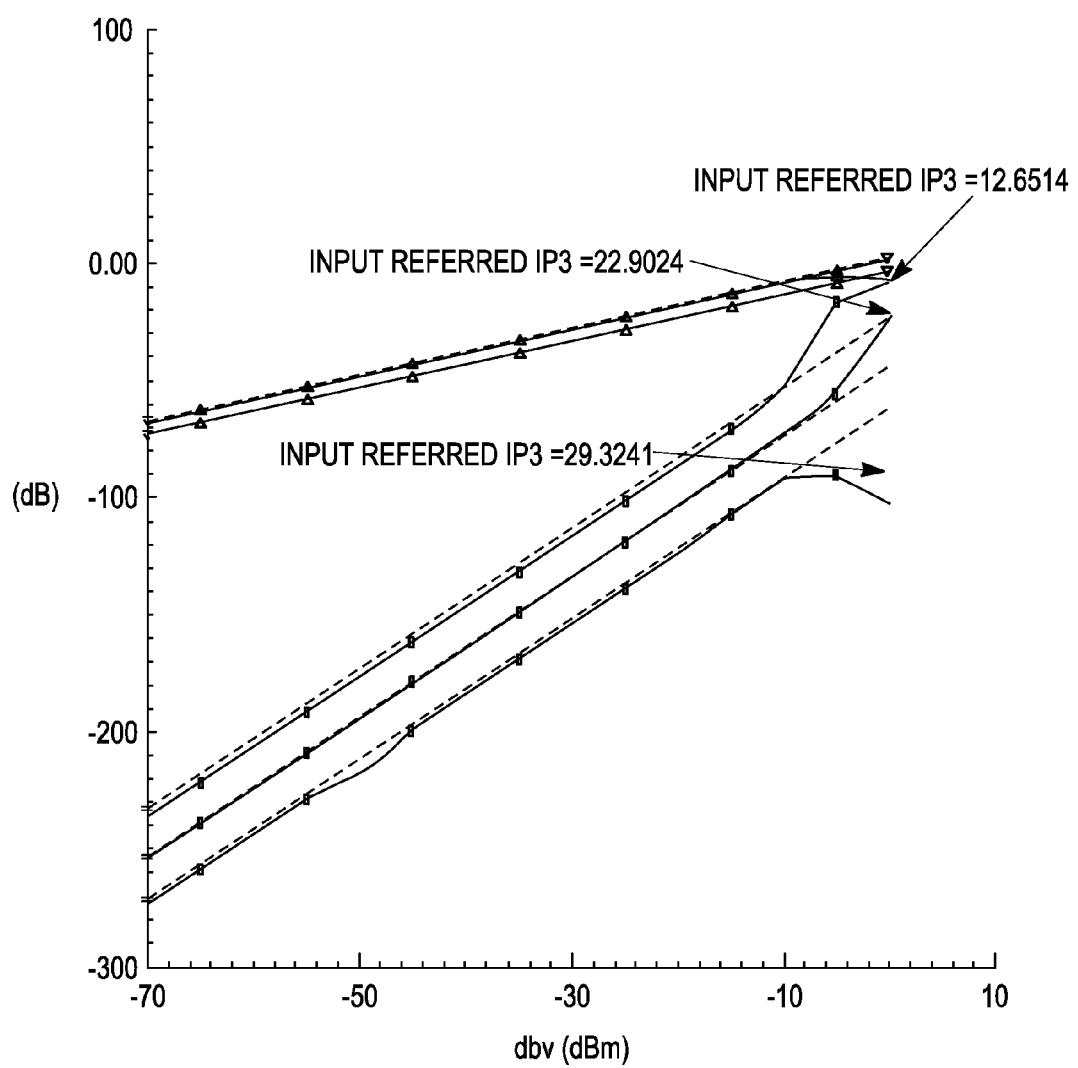
FIG. 9 depicts a graph having brown and blue curves representing IIP3 performance of a standard Class A Emitter Follower biased at 1 mA and 2 mA, respectively, and a red curves representing the performance of the present invention, in accordance with one embodiment of the present invention. Two tones were used at 500 kHz and 999 kHz offsets generating a 3rd order term at 1 khz.

With reference to FIG. 9, blue and brown curves represent IIP3 performance of a standard Class A Emitter Follower biased at 1 mA and 2 mA respectively and the aquamarine curve represents the performance of the post-mixer amplifier 100 of the present invention. With reference to FIG. 14D, blue and brown curves represent IIP2 performance of a standard Class A Emitter Follower biased at 1 mA and 2 mA respectively and the aquamarine curve represents the performance of the post-mixer amplifier 100 of the present invention. Two tones were used at 500 kHz and 999 kHz offsets generating a $3^{rd}$ order term at 1 khz.

Figure 10:
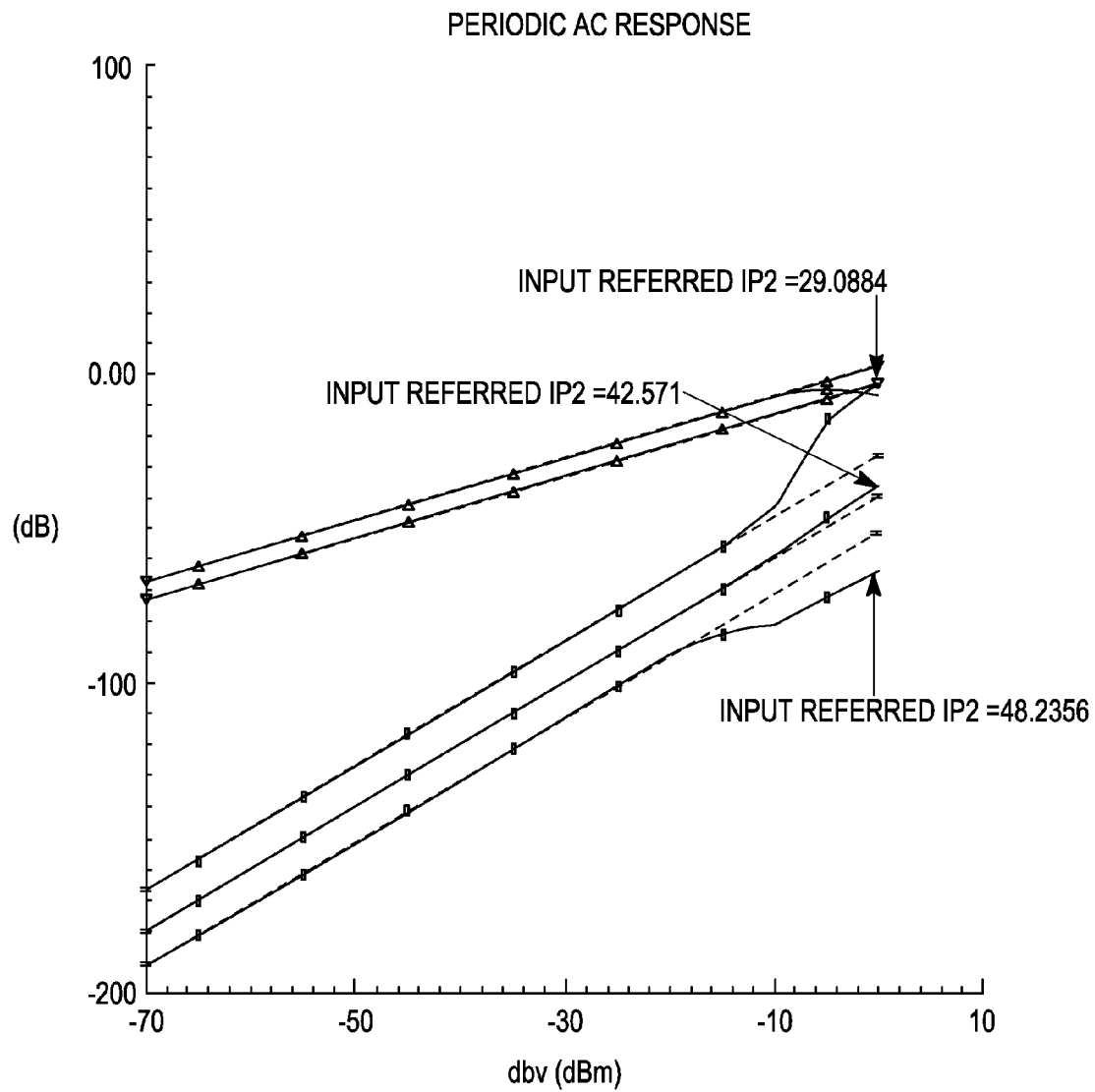
FIG. 10 depicts a graph having brown and blue curves representing IIP2 performance of a standard Class A Emitter Follower biased at 1 mA and 2 mA, respectively, and a red curves representing the performance of the present invention, in accordance with one embodiment of the present invention. Two tones were used at 500 kHz and 999 kHz offsets generating a 3rd order term at 1 khz.

FIGS. 9 and 10 show that at 300 uA bias current, the architecture is capable of outperforming a Class A levelshifter biased at 2 mA by 6 dB, which is a more than 6.5× power reduction savings for 6 dB more IIP2 and IIP3 performance. Compared to the Class A level-shifter biased at 1 mA, the architecture achieves 17 dB more IIP3 and IIP2 performance at 3.3× less power. The drop at the higher end of the $2^{nd}$ and $3^{rd}$ order slopes are the result of the VPNP taking over providing the pull-up action and reducing the $2^{nd}$ and $3^{rd}$ order term further. The supporting circuitry of the post-mixer amplifier 100 consumes negligible current, <80 uA and much of the voltage biasing circuitry can be shared in a differential setup.

Figure 11:
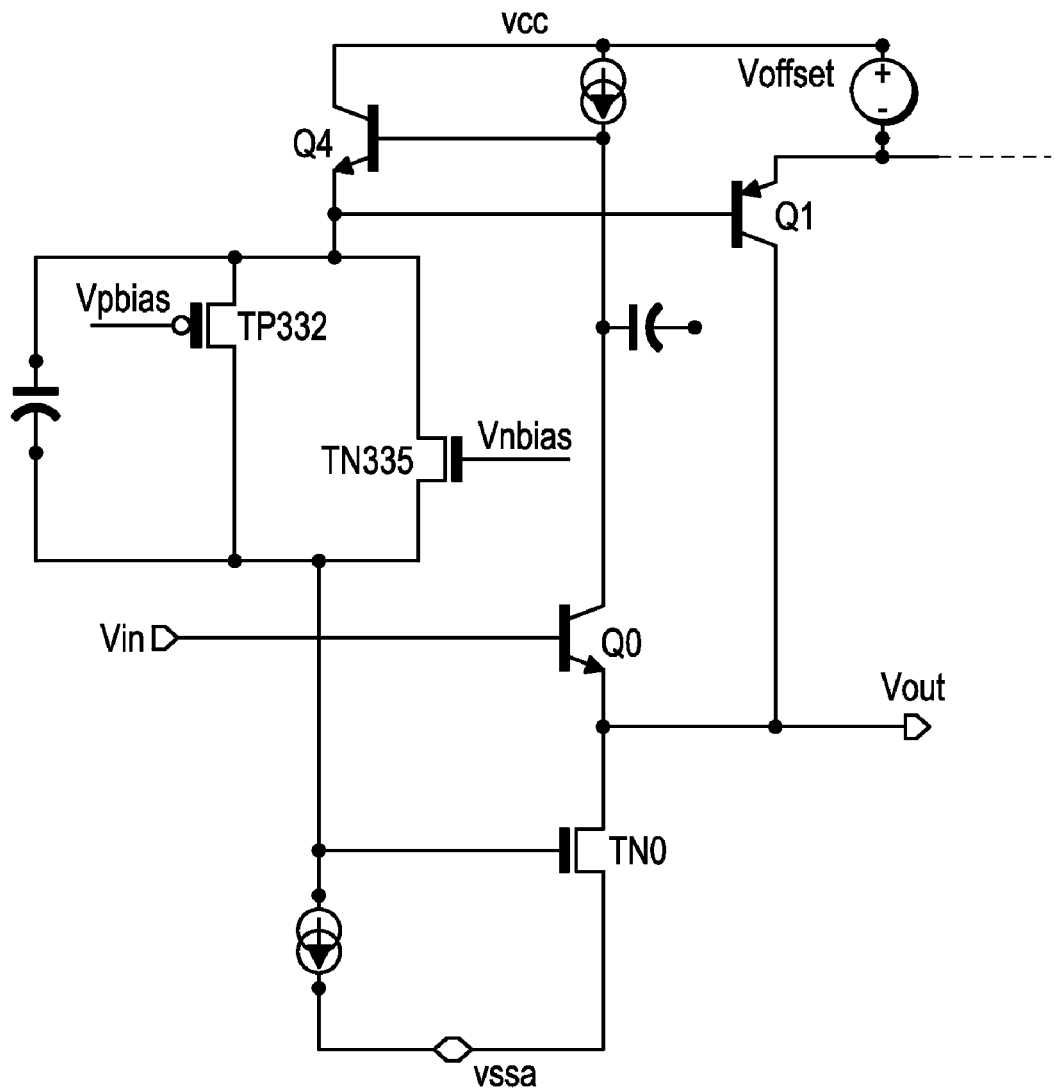
FIG. 11 depicts a schematic representation of a portion of a post-mixer amplifier, in accordance with one embodiment of the present invention.

One embodiment of the class-AB unity gain buffer within the post-mixer amplifier 100 is illustrated in FIG. 11. The class-AB unity gain buffer illustrated in FIG. 11 has several advantages: first, it is simpler and thus provides similar linearity performance as prior designs at only 200 uA quiescent current; and second it has lower voltage stackup requirements, (pb1 needs V0+Vbe$_{Q1}$+Vgs$_{TP332}$ where V0 is only about 200-300 mV and nb1 needs Vgs$_{TN0}$+Vgs$_{TP335}$). The combinations of base-emitter voltage $V_{be}$ and $V_{gs}$ of transistors V0 (implemented with a very wide NFET in diode configuration), Q1 and Q4 provide temperature compensation so that the collector of Q0 is never forward biased and neither is the current source I2 compressed into saturation at voltage, process, temperature and signal swing limits. By observation, if temperature decreases, the various $V_{gs}$ and $V_{be}$ will increase but although Q1 expands downwards, Q4 base voltage expands upwards cancelling the former's temperature effects. Net voltage movement is then set by V0 (Vgs) expansion downwards which allow for expanded headroom requirements of I2 current mirror. The combination of Q1+magic resistor+TN0 provides a Class-AB action. The application of the class-AB unity gain buffer can be applied to any of the circuits desiring high linearity class AB buffering and level-shifting.

The post-mixer amplifier 100 may be used in an SDR (software-defined radio) radio environment within any device that employs a SDR. In the SDR radio environment, multiple radio standards must be supported and there is a very fine balance between linearity and sensitivity, due to gain compromising linearity. Providing a post-mixer amplifier 100 having at least two configurations in order to compromise either linearity or sensitivity, allows an SDR integrated circuit (IC) to cater to a much wider set of applications.

Figure 12:
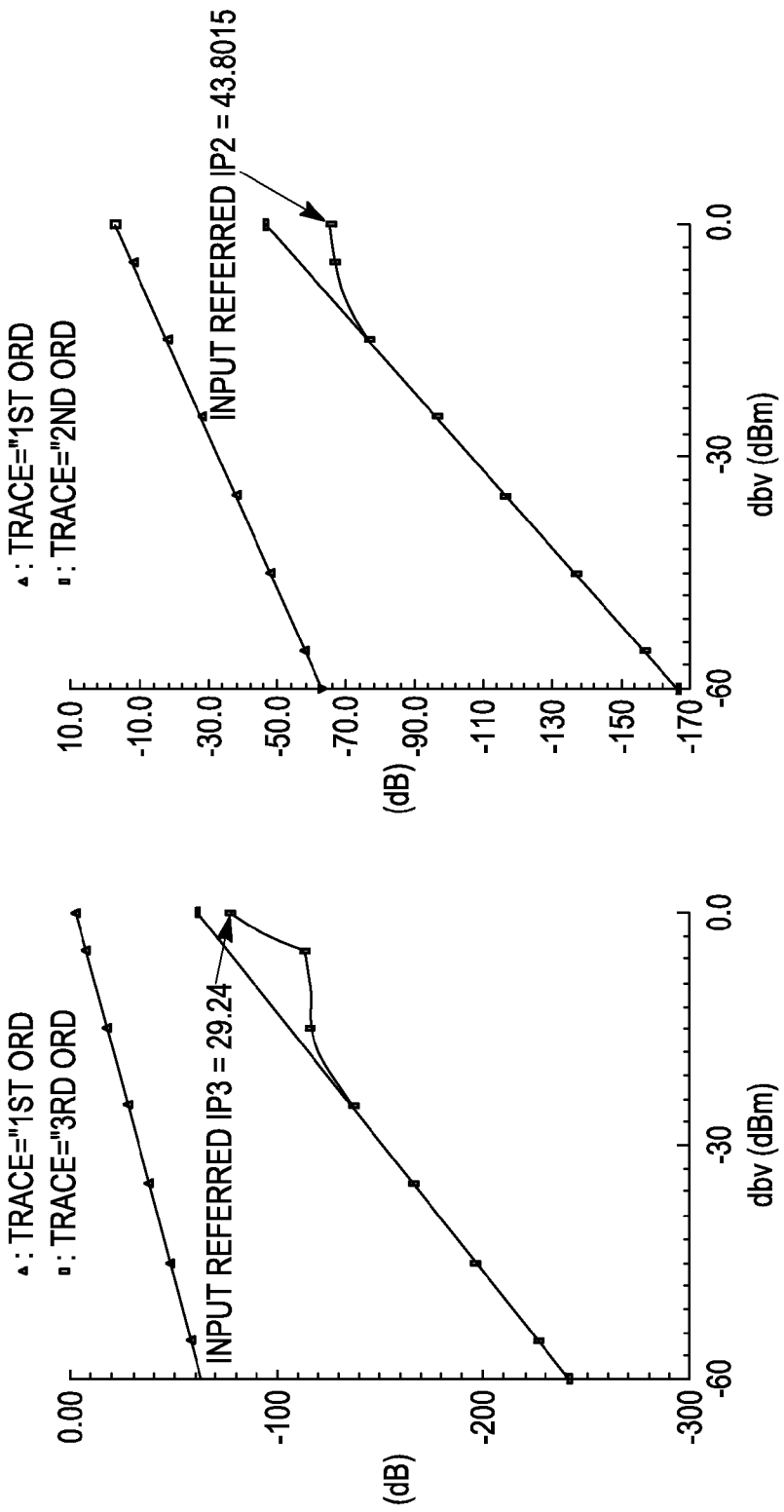
FIG. 12 depicts a graph of the performance of a Class AB voltage shifting buffer, in accordance with one embodiment of the present invention.

FIG. 12 depicts a graph of the IP2 and IP3 performance of a Class AB voltage shifting buffer.

With reference to FIG. 13, a post-mixer amplifier 100 having an alternative 'positive input path' using first switch 103 at positive signal input (In+) 102 is provided within the post-mixer amplifier 100 such that the ratio of resistors determining the gain can be altered using resistor 124 (R3a) without reducing the total series resistance and thus not burn additional power at a lower gain setting. An alternative 'negative input path' using second switch 105 at negative signal input (In−) 104 is also shown which has same arrangement as the positive input path.

With reference to FIG. 13, post-mixer amplifier 100 receives and processes signals for use in a software-defined radio integrated circuit. Post-mixer amplifier 100 includes a voltage amplifier 114, a push-pull unity gain follower 116 connected with the voltage amplifier 114, a positive signal input 102 connected with a first switch 103 and a positive signal output 122 connected with the push-pull unity gain follower 116, first and second bipolar junction transistors 110, 112, and first, second, and third resistors 120, 124, and 126.

In one embodiment, post-mixer amplifier 100 is connected with a passive mixer 200 receiving radio frequency signals at an input 206 and outputting positive and negative signals via positive output 202 and negative output 204, respectively. Positive and negative signals output by passive mixer 200 are received by post-mixer amplifier 100 at positive signal input 102 and negative signal input 104, respectively. Since post-mixer amplifier 100 includes identical positive signal and negative signal paths to process either positive or negative signals entering either positive signal input 102 or negative signal input 104, respectively, for simplicity only the positive signal path will be described in detail herein.

Positive signals output by passive mixer 200 at positive output 202 and received by post-mixer amplifier 100 at positive signal input 102 enter first switch 103. First switch 103 is connected with either first signal path 106 or second signal path 108, depending on the desired gain setting for the post-mixer amplifier device 100. For example, in one embodiment, if a low gain setting is desired for the post-mixer amplifier device 100 then first signal path 106 is used and if a high gain setting is desired for the post-mixer amplifier device 100 then second signal path 108 is used.

When connected with first signal path 106, a first portion of the positive signal is routed through first bipolar junction transistor 110 and to voltage amplifier 114 and a second portion of the positive signal is routed through first bipolar junction transistor 110 and into a first current feedback loop 118 connected with the positive signal output 122 via first resistor 120. Specifically, when connected with first signal path 106, the first portion of the positive signal is routed through an input of the first bipolar junction transistor 110 and out through a first collector 111 connected with a second input 115 of the voltage amplifier 114.

Voltage amplifier 114 includes first and second inputs 113, 115 and a first output 117. Voltage amplifier 114 provides substantial gain to an error signal representing the difference between signal voltages at input 113 and 115.

Upon being processed by voltage amplifier 114, the positive signal then enters the push-pull unity gain follower 116. Push-pull unity gain follower 116 includes a third input 119 and a second output 121. The push-pull unity gain follower provides a low output impedance for driving a load at its output and provides high linearity yet requires a minimum amount of supply current. The second output 121 is connected with the positive signal output 122 and the third input 119 is connected with the first output 117 of the of the voltage amplifier 114. The first portion of the positive signal is therefore routed through the voltage amplifier 114 and the push-pull unity gain follower 116 and to the positive signal output 122.

When connected with first signal path 106, the second portion of the positive signal is routed through the input of the first bipolar junction transistor 110 and out through a first emitter 131. The second portion of the positive signal is then routed into first current feedback loop 118 and eventually to the positive signal output 122 via only first resistor 120.

When connected with second signal path 108, a first portion of the positive signal is routed through second bipolar junction transistor 112 and to voltage amplifier 114 and a second portion of the positive signal is routed through second bipolar junction transistor 112 and into a second current feedback loop 121 connected with the positive signal output 122 via first and second resistors 120, 124. Specifically, when connected with second signal path 108, the first portion of the positive signal is routed through an input of the second bipolar junction transistor 112 and out through a second collector 123 connected with second input 115 of the voltage amplifier 114. Additionally, when connected with second signal path 108, the second portion of the positive signal is routed through an input of the second bipolar junction transistor 112 and out through a second emitter 125. The second portion of the positive signal is then routed into second current feedback loop 121 and eventually to the positive signal output 122 via both first and second resistors 120, 124. Since post-mixer amplifier 100 includes two signal paths 106, 108 each with a different resistance, the gain of the post-mixer amplifier 100 may be varied by selecting which signal path 106, 108 to route the positive signal through. Additionally, by using bipolar junction transistors 110, 112 instead of MOS field effect transistors there is substantially less flicker noise.

In one embodiment, first and second transistors 110, 112 are both low-noise bipolar junction transistors, whose implementation is known in the art. The low-noise transistors are designed such that the noise produced by the transistor parasitic resistances is smaller than the noise from the other devices within the post-mixer amplifier 100. Using bipolar junction transistors allows low noise, including flicker noise, to be achieved with a relatively small area on an integrated circuit compared to MOS transistors. Moreover, using low noise bipolar junction transistors can provide a higher transconductance per unit area than MOS transistors. Additionally, post-mixer amplifier 100 includes a third resistor ($R_{1a}$) 126 connected at one end with both the second resistor 124 and the second current feedback loop 121, and at a second end with Output B 136. Post-mixer amplifier 100 also includes a fourth resistor ($R_{ref}$) 128 which is connected with a voltage supply 130 at one end, and both first input 113 and Output A 134 at a second end. Post-mixer amplifier 100 also includes a fifth resistor ($R_{La}$) 132 which is connected with the voltage supply at one end and both second input 115 and second collector 123 at a second end. Fifth resistor 132 provides a passive load to both first and second bipolar junction transistors 110, 112.

Since the first and second bipolar junction transistors 110, 112 include emitters which each have different gain setting resistance, a ratio which sets a closed-loop gain of the overall post-mixer amplifier device is different based on which one of the first and second bipolar junction transistors 110, 112 are selected by the first switch 103.

Negative signals output by passive mixer 200 at negative output 204 and received by post-mixer amplifier 100 at negative signal input 104 enter second switch 105 and exit through negative signal output 156 via third and fourth paths 140, 142 which mirror first and second paths 106, 108, respectively.

Second switch 105 is connected with either third signal path 140 or fourth signal path 142, depending on the desired gain setting for the post-mixer amplifier device 100. Third signal path routes the negative signals through a third transistor 146, a voltage amplifier 148, a push-pull unity gain follower 150, and a sixth resistor ($R2b$) 154 to negative signal output 156. Fourth signal path routes the negative signals through a fourth transistor 146, voltage amplifier 148, push-pull unity gain follower 150, sixth resistor ($R_{2b}$) 154, and seventh resistor ($R_{3b}$) 158 to negative signal output 156. Additionally, an eighth resistor ($R_{1b}$) 160 is used to route the negative signal to Output B 136 and a ninth resistor ($R_{1b}$) 166 is used to route a signal from the voltage supply 130 to a collector of third transistor 144 and a collector of fourth transistor 146.

In one embodiment, push-pull unity gain followers 116, 150 are class AB voltage followers, wherein the push-pull unity gain followers provides class AB sourcing and sinking transistors down to DC frequencies via a negative feedback loop, and wherein one of sinking and sourcing transistors has quiescent current fixed by a magic resistor biased via replica biasing methods. Replica biasing is a known technique whereby replica copies of circuit devices are operated under controlled conditions in order to produce a voltage or current for biasing the circuit device. The magic resistor provides a high resistance under normal quiescent operation and a reduced resistance under the higher current of class-AB operation thereby preventing an excessive voltage drop, as disclosed in the previous descriptions of FIGS. 6 and 7.

With reference to FIG. 13, it can be deduced by observation that two gain settings can be obtained: 1) $Av1=1+(R2a+R3a)/R1a$; and 2) $Av2=1+R2a/(R3a+R1a)$. Allowing for two gain settings, Av1 and Av2, provides an additional advantage in that at the lower gain setting of Av2, where an additional LNA preceding the input 206 may be used to provide more upfront gain to have better sensitivity, the added degeneration resistance afforded by resistor 124 ($R3a$) improves the overall linearity of the post-mixer amplifier 100. Although there is added noise, the added noise is no longer critical due to the higher upfront gain. As a result, including alternative input paths via switches 103, 105 in post-mixer amplifier 100 provides a good noise-linearity trade-off while maintaining dynamic power consumption across all gain settings.

In accordance with one embodiment, performance for post-mixer amplifier 100 is as shown in TABLES 1A and 1B below for 20 dB gain. TABLE 1A depicts performance with tones at 500 kHz+999 kHz, and TABLE 1B depicts performance with tones at 50 kHz+99 khz.

TABLE 1A

| Corner | Idc/PMA (uA) | Power (mW) | IIP3 @ −20 (Differential, dBV) | IIP2 (S.Ended, dBV) | NoiseAv (1 Hz-10 kHz) (nV/rtHz) | BW (MHz) |
| --- | --- | --- | --- | --- | --- | --- |
| Nom | 1333 | 3.7 | 29.5 | 66.7 | 2.877 | 11.3 |
| LowPwr | 897.5 | 2.5 | 26.37 | 65.0 | 2.908 | 11.82 |

TABLE 1B

| Corner | Idc/PMA (uA) | Power | IIP3 @ −20 (Dif, dBV) | IIP2 @ −20 (SE, dBV) | NoiseAv (1 k-10 kHz) | BW (MHz) |
| --- | --- | --- | --- | --- | --- | --- |
| Nom | 1333 | 3.7 | 43.6 | 99.8 | 2.877 | 11.5 |
| LowPwr | 897.5 | 2.5 | 44.2 | 97.9 | 2.908 | 11.82 |

As shown in TABLES 1A and 1B, the 'LowPwr' setting is when the bias current of the voltage-follower buffer was halved.

With reference to TABLE 1C, comparative results of two gain settings show that while the 'AC gain' differs by only 4.43 dB, the IIP3 difference is ~6.5 dB which shows that the extra degeneration resistance added in the 15 dB gain setting improved the IIP3 by 2.1 dB while the noise performance took a hit and increased by 0.4 nV/rtHz of which can be absorbed with an upfront external gain block.

TABLE 1C

| Gain Setting | 20 Db | 15 dB | Delta |
| --- | --- | --- | --- |
| vcc | 2.775 | 2.775 | |
| NoiseAve (nVrtHz) | 3.087 | 3.407 | 0.320 |
| AC Gain (dB) | 19.760 | 15.330 | −4.430 |
| IP3 (diffout) (dBV) | 30.190 | 36.730 | 6.540 |
| IP3 (se out) (dBV) | 30.200 | 36.730 | 6.530 |
| IP2 (se out) (dBV) | 65.190 | 69.520 | 4.330 |

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Those skilled in the art will recognize that it is common within the art to implement devices and/or processes and/or systems in the fashion(s) set forth herein, and thereafter use engineering and/or business practices to integrate such implemented devices and/or processes and/or systems into more comprehensive devices and/or processes and/or systems. That is, at least a portion of the devices and/or processes and/or systems described herein can be integrated into comprehensive devices and/or processes and/or systems via a reasonable amount of experimentation. Those having skill in the art will recognize that examples of such comprehensive devices and/or processes and/or systems might include—as appropriate to context and application—all or part of devices and/or processes and/or systems of (a) an air conveyance (e.g., an airplane, rocket, hovercraft, helicopter, etc.), (b) a ground conveyance (e.g., a car, truck, locomotive, tank, armored personnel carrier, etc.), (c) a building (e.g., a home, warehouse, office, etc.), (d) an appliance (e.g., a refrigerator, a washing machine, a dryer, etc.), (e) a communications system (e.g., a networked system, a telephone system, a Voice over IP system, etc.), (f) a business entity (e.g., an Internet Service Provider (ISP) entity such as Comcast Cable, Quest, Southwestern Bell, etc.); or (g) a wired/wireless services entity such as Sprint, Cingular, Nextel, etc.), etc.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims. Accordingly, the invention is not to be restricted except in light of the appended claims and their equivalents.

The invention claimed is:

1. A post-mixer amplifier device which receives and processes signals for use in a radio integrated circuit comprising:
a voltage amplifier having first and second inputs and a first output;
a push-pull unity gain follower having a third input and a second output, wherein the third input is connected with the first output of the voltage amplifier;
a positive signal output connected with the second output of the push-pull unity gain follower;
a positive signal input connected with a first switch, wherein the first switch is selectable between a first pathway and a second pathway;
a first bipolar junction transistor coupled to the positive signal input via the first switch along the first pathway, the first bipolar junction transistor having a first collector connected with the first input of the voltage amplifier and a first emitter coupled to the second output of the push-pull unity gain follower via a first resistance and forming a first current feedback pathway; and
a second bipolar junction transistor coupled to the positive signal input via the first switch along the second pathway, the second bipolar junction transistor having a second collector connected with the first input of the voltage amplifier and a second emitter coupled to the second output of the push-pull unity gain follower via a second resistance and forming a second current feedback pathway;
wherein the first and second bipolar junction transistors each drive passive resistive loads, coupled to the second output of the push-pull unity gain follower and the positive signal output, at their respective emitters, the passive resistive loads comprising the first and the second resistances, respective.

2. The device of claim 1, wherein the first resistance comprises first resistor connected at a first end with the first emitter and at a second end with the second output of the push-pull unity gain follower and the second resistance comprises the first resistor in series with a second resistor connected at a first end with the second emitter and at a second end with the first end of the first resistor.

3. The device of claim 2, wherein a gain of the post-mixer amplifier device may be varied by switching from the first pathway to the second pathway via the first switch.

4. The device of claim 1, wherein the post-mixer amplifier device includes additional transistors, and first and second bipolar junction transistors have lower noise components than all other additional transistors in the post-mixer amplifier device.

5. The device of claim 1, wherein the voltage amplifier is a voltage-mode operational amplifier.

6. The device of claim 1, wherein the push-pull unity gain follower is a class AB voltage follower.

7. The device of claim 1, wherein the first and second bipolar junction transistors include emitters that each have different gain setting resistance as a function of the first and second resistances such that a ratio that sets a closed-loop gain of the overall post-mixer amplifier device is different based on which one of the first and second bipolar junction transistors is selected via the first switch.

8. A post-mixer amplifier device which receives and processes signals for use in a radio integrated circuit comprising:
a voltage amplifier having first and second inputs and a first output;
a push-pull unity gain follower having a third input and a second output, wherein the third input is connected with the first output of the voltage amplifier;
a positive signal output connected with the second output of the push-pull unity gain follower;
a positive signal input; and
a first bipolar junction transistor coupled to the positive signal input and having a first collector connected with the first input of the voltage amplifier and a first emitter coupled to the second output of the push-pull unity gain follower via a first resistance and forming a first current feedback pathway;
wherein the first bipolar junction transistor drives a passive resistive load, coupled to the second output of the push-pull unity gain follower and the positive signal output, at its emitter, the passive resistive load comprising the first resistance.

9. The device of claim 8, wherein the first resistance comprises a resistor connected at a first end with the first emitter and at a second end with the second output of the push-pull unity gain follower.

10. The device of claim 8, wherein the post-mixer amplifier device includes additional transistors, and the first bipolar junction transistor has lower noise components than all other additional transistors in the post-mixer amplifier device.

11. The device of claim 8, wherein the voltage amplifier is a voltage-mode operational amplifier.

12. A radio integrated circuit comprising:
- a passive mixer outputting positive and negative signals;
- a post-mixer amplifier which receives and processes the positive and negative signals, wherein the post-mixer amplifier includes:
    - a voltage amplifier having first and second inputs and a first output;
    - a push-pull unity gain follower having a third input and a second output, wherein the third input is connected with the first output of the voltage amplifier;
    - a positive signal output connected with the second output of the push-pull unity gain follower;
    - a positive signal input that receives the positive signal generated by the passive mixer; and
    - a first bipolar junction transistor coupled to the positive signal input and having a first collector connected with the first input of the voltage amplifier and a first emitter coupled to the second output of the push-pull unity gain follower via a first resistance and forming a first current feedback pathway;
- wherein the first bipolar junction transistor drives a passive resistive load, coupled to the second output of the push-pull unity gain follower and the positive signal output, at its emitter, the passive resistive load comprising the first resistance.

13. The integrated circuit of claim 12, wherein the fist resistance includes a resistor connected at a first end with the first emitter and at a second end with the second output of the push-pull unity gain follower.

14. The integrated circuit of claim 12, wherein the positive signal input is connected with a first switch, and wherein the first switch is selectable between the first pathway, including the first bipolar junction transistor, and a second pathway, including a second bipolar junction transistor.

15. The integrated circuit of claim 14, wherein a gain of the post-mixer amplifier device may be varied by switching from the first pathway to the second pathway.

16. The integrated circuit of claim 12, wherein the post-mixer amplifier includes additional transistors, and the first bipolar junction transistor lower noise components than all other additional transistors in the post-mixer amplifier.

* * * * *

UNITED STATES PATENT AND TRADEMARK OFFICE
CERTIFICATE OF CORRECTION

PATENT NO. : 8,324,956 B2  
APPLICATION NO. : 12/980147  
DATED : December 4, 2012  
INVENTOR(S) : Chee et al.

Page 1 of 1

It is certified that error appears in the above-identified patent and that said Letters Patent is hereby corrected as shown below:

In the Specifications:

In Column 6, Line 23, delete "$V_g$," and insert -- $V_{gs}$, --, therefor.

In Column 9, Line 47, delete "(R2b)" and insert -- $(R_{2b})$ --, therefor.

In Column 9, Line 53, delete "($R_{1b}$)" and insert -- $(R_{Lb})$ --, therefor.

In the Claims:

In Column 12, Line 22, in Claim 1, delete "respective." and insert -- respectively. --, therefor.

In Column 14, Line 12, in Claim 13, delete "fist" and insert -- first --, therefor.

Signed and Sealed this  
Sixteenth Day of April, 2013

Teresa Stanek Rea  
*Acting Director of the United States Patent and Trademark Office*